(12) United States Patent
Berzins et al.

(10) Patent No.: US 10,784,864 B1
(45) Date of Patent: Sep. 22, 2020

(54) LOW POWER INTEGRATED CLOCK GATING SYSTEM AND METHOD

(71) Applicant: Samsung Electronics Co., Ltd., Suwon-si, Gyeonggi-do (KR)

(72) Inventors: Matthew Berzins, Cedar Park, TX (US); Lalitkumar Motagi, Austin, TX (US); Shyam Agarwal, Austin, TX (US)

(73) Assignee: SAMSUNG ELECTRONICS CO., LTD. (KR)

(*) Notice: Subject to any disclaimer, the term of this patent is extended or adjusted under 35 U.S.C. 154(b) by 0 days.

(21) Appl. No.: 16/533,738

(22) Filed: Aug. 6, 2019

Related U.S. Application Data

(60) Provisional application No. 62/818,094, filed on Mar. 13, 2019.

(51) Int. Cl.
| | | |
|---|---|---|
| *H03K 19/00* | (2006.01) | |
| *G06F 1/3237* | (2019.01) | |
| *H03C 3/09* | (2006.01) | |
| *G06F 1/08* | (2006.01) | |

(52) U.S. Cl.
CPC .......... *H03K 19/0016* (2013.01); *G06F 1/08* (2013.01); *G06F 1/3237* (2013.01); *H03C 3/0966* (2013.01)

(58) Field of Classification Search
None
See application file for complete search history.

(56) References Cited

U.S. PATENT DOCUMENTS

| | | |
|---|---|---|
| 7,902,878 B2 | 3/2011 | Saint-Laurent et al. |
| 8,030,982 B2 | 10/2011 | Datta et al. |
| 8,604,831 B2 | 12/2013 | Myers et al. |
| 8,975,949 B2 * | 3/2015 | Berzins ............... H03K 3/356 327/399 |
| 9,564,897 B1 | 2/2017 | Berzins et al. |
| 9,577,635 B2 | 2/2017 | Rasouli et al. |
| 9,887,698 B2 | 2/2018 | Liu et al. |
| 10,298,235 B2 * | 5/2019 | Lim .................. H03K 23/58 |
| 2010/0109707 A1 | 5/2010 | Srivastava et al. |
| 2015/0145577 A1 | 5/2015 | Berzins et al. |
| 2016/0315616 A1 | 10/2016 | Kim et al. |
| 2016/0373112 A1 | 12/2016 | Hwang et al. |
| 2018/0167058 A1 | 6/2018 | Rasouli et al. |

* cited by examiner

*Primary Examiner* — Jeffery S Zweizig
(74) *Attorney, Agent, or Firm* — Renaissance IP Law Group LLP

(57) ABSTRACT

According to one general aspect, an apparatus may include a latch circuit configured to, depending in part upon a state or at least one enable signal, pass a clock signal to an output signal. The latch circuit may include an input stage controlled by the clock signal and the enable signal(s). The latch may include an output stage configured to produce the output signal. The input and output stages may share a common transistor controlled by the clock signal.

9 Claims, 10 Drawing Sheets

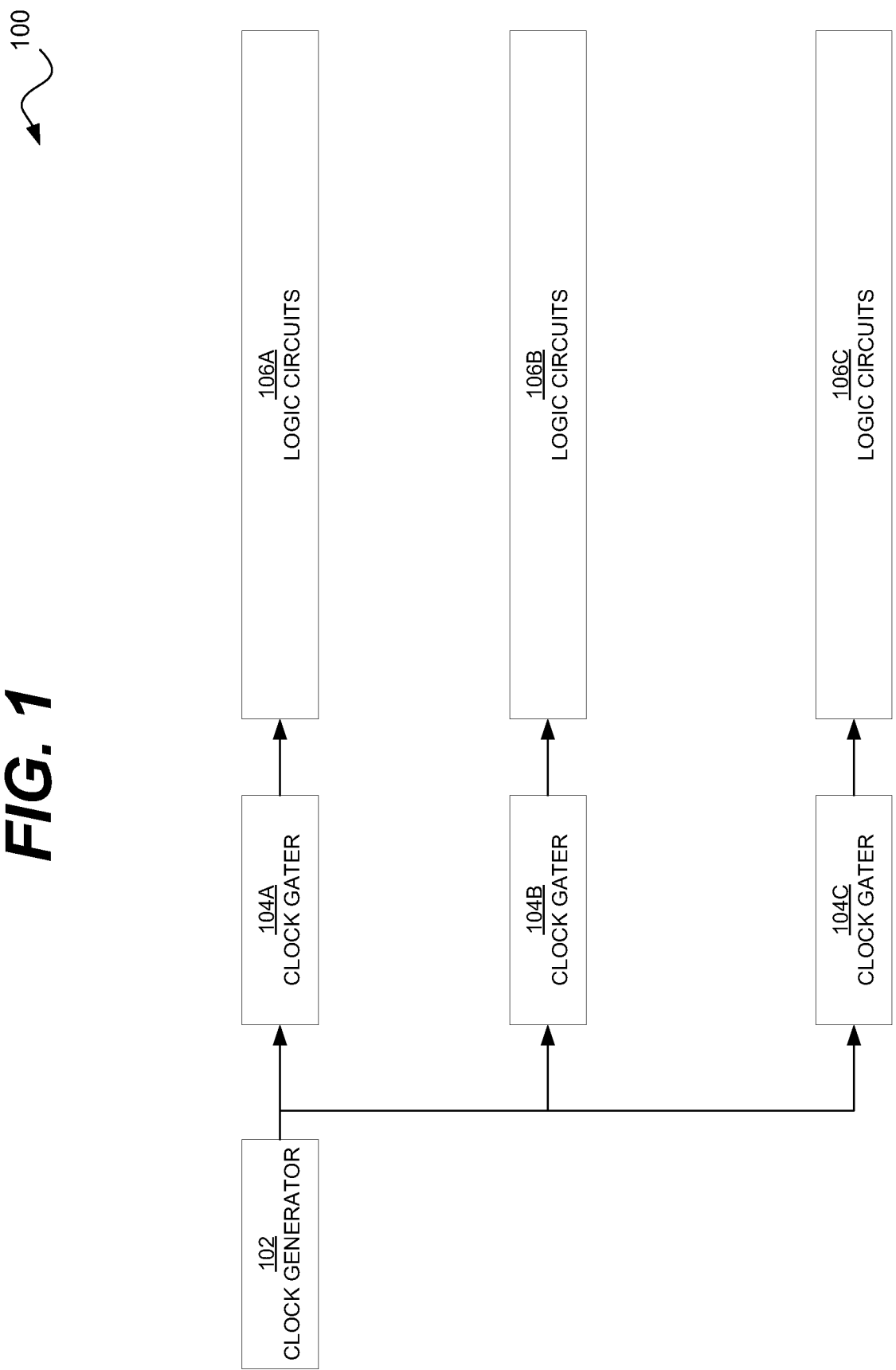

LOW POWER INTEGRATED CLOCK GATING SYSTEM AND METHOD

CROSS-REFERENCE TO RELATED APPLICATION

This application claims priority under 35 U.S.C. § 119 to Provisional Patent Application Ser. No. 62/818,094, entitled "LOW POWER INTEGRATED CLOCK GATING SYSTEM AND METHOD" filed on Mar. 13, 2019. The subject matter of this earlier filed application is hereby incorporated by reference.

TECHNICAL FIELD

This description relates to clock management and more specifically to a low power integrated clock gating system and method.

BACKGROUND

Clock gating is a popular technique used in many synchronous circuits for reducing dynamic power dissipation. Clock gating saves power by adding more logic to a circuit to prune the clock tree. Pruning the clock disables portions of the circuitry so that the flip-flops in them do not have to switch states. Switching states consumes power. When not being switched, the switching power consumption goes to zero, and only leakage currents are incurred.

In electronics, a flip-flop is a circuit that has two stable states and can be used to store state information. A flip-flop is a bi-stable multi-vibrator. The circuit can be made to change state by signals applied to one or more control inputs and will have one or two outputs. It is the basic storage element in sequential logic. Flip-flops and latches are fundamental building blocks of digital electronics systems used in computers, communications, and many other types of systems.

SUMMARY

According to one general aspect, an apparatus may include a latch circuit configured to, depending in part upon a state or at least one enable signal, pass a clock signal to an output signal. The latch circuit may include an input stage controlled by the clock signal and the enable signal(s). The latch may include an output stage configured to produce the output signal. The input and output stages may share a common transistor controlled by the clock signal.

According to another general aspect, an apparatus may include a latch circuit configured to, depending in part upon a state or at least one enable signal, pass a clock signal to an output signal. The latch circuit may include a feedback circuit configured to hold the output signal. The feedback circuit may include an inverter powered by the output signal.

According to another general aspect, a system may include a clock generator circuit configured to generate a first clock signal. The system may include a clock gater circuit configured to receive the first clock signal, and at least one enable signal as input, and generate a second clock signal. The system may include a logic circuit configured to perform a logic function synchronized, at least in part by the second clock signal. The clock gater circuit may include an input stage controlled by the first clock signal and the enable signal(s). The clock gater circuit may include an output stage configured to produce the second clock signal. The input and output stages may share a common transistor controlled by the first clock signal.

The details of one or more implementations are set forth in the accompanying drawings and the description below. Other features will be apparent from the description and drawings, and from the claims.

A system and/or method for clock management and more specifically to a low power integrated clock gating system and method, substantially as shown in and/or described in connection with at least one of the figures, as set forth more completely in the claims.

BRIEF DESCRIPTION OF THE DRAWINGS

FIG. 1 is a block diagram of an example embodiment of a system in accordance with the disclosed subject matter.

Like reference symbols in the various drawings indicate like elements.

DETAILED DESCRIPTION

Figure 2A:
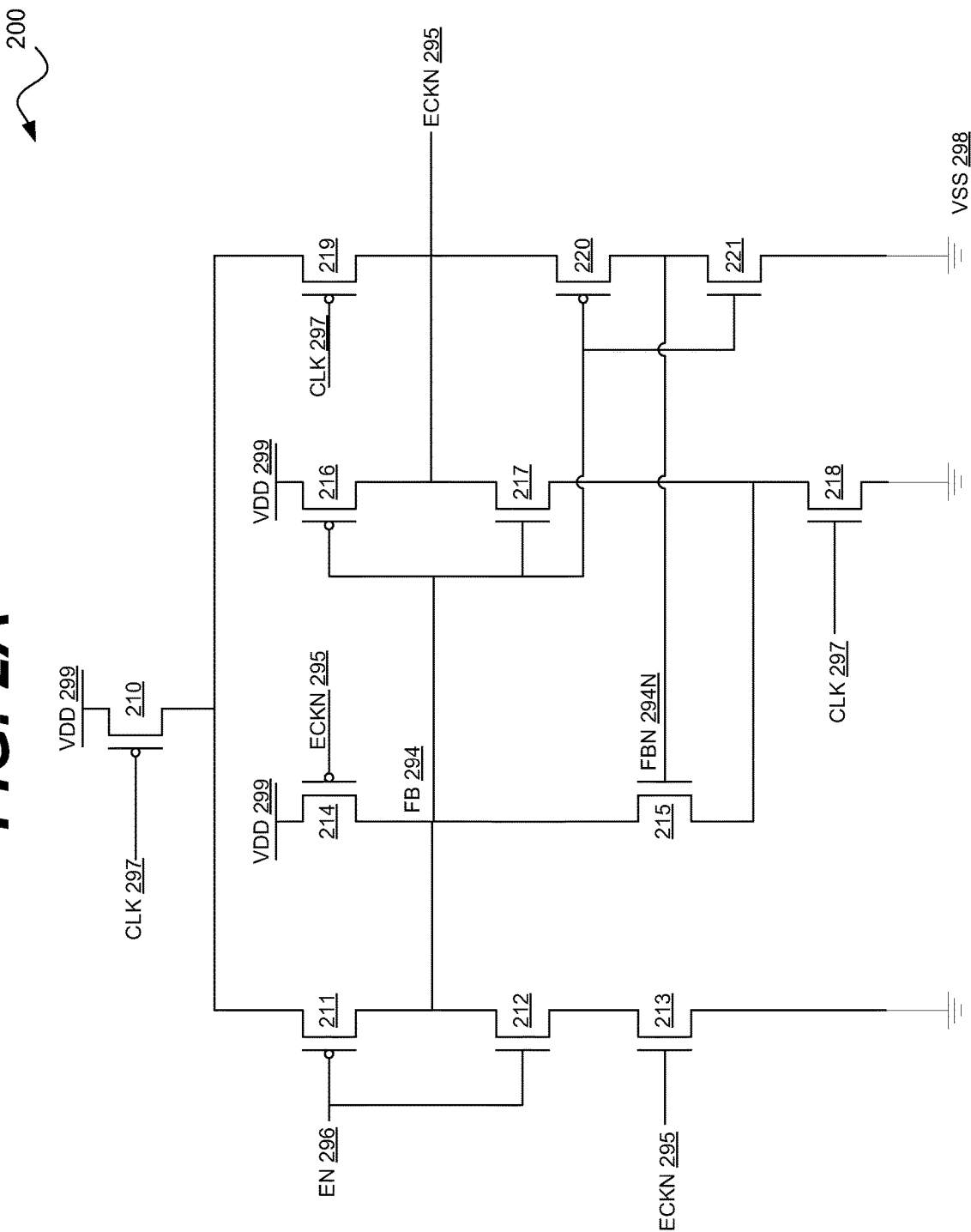
FIGS. 2A, 2B and 2C are circuit diagrams of an example embodiment of a system in accordance with the disclosed subject matter.

Various example embodiments will be described more fully hereinafter with reference to the accompanying drawings, in which some example embodiments are shown. The present disclosed subject matter may, however, be embodied in many different forms and should not be construed as limited to the example embodiments set forth herein. Rather, these example embodiments are provided so that this disclosure will be thorough and complete, and will fully convey the scope of the present disclosed subject matter to those skilled in the art. In the drawings, the sizes and relative sizes of layers and regions may be exaggerated for clarity.

It will be understood that when an element or layer is referred to as being "on," "connected to" or "coupled to" another element or layer, it may be directly on, connected or coupled to the other element or layer or intervening elements or layers may be present. In contrast, when an element is referred to as being "directly on", "directly connected to" or "directly coupled to" another element or layer, there are no intervening elements or layers present Like numerals refer to like elements throughout. As used herein, the term "and/or" includes any and all combinations of one or more of the associated listed items.

It will be understood that, although the terms first, second, third, and so on may be used herein to describe various elements, components, regions, layers and/or sections, these elements, components, regions, layers and/or sections should not be limited by these terms. These terms are only used to distinguish one element, component, region, layer, or section from another region, layer, or section. Thus, a first element, component, region, layer, or section discussed below could be termed a second element, component, region, layer, or section without departing from the teachings of the present disclosed subject matter.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" may encompass both an orientation of above and below. The device may be otherwise oriented (rotated 90 degrees or at other orientations) and the spatially relative descriptors used herein interpreted accordingly.

Likewise, electrical terms, such as "high" "low", "pull up", "pull down", "1", "0" and the like, may be used herein for ease of description to describe a voltage level or current relative to other voltage levels or to another element(s) or feature(s) as illustrated in the figures. It will be understood that the electrical relative terms are intended to encompass different reference voltages of the device in use or operation in addition to the voltages or currents depicted in the figures. For example, if the device or signals in the figures are inverted or use other reference voltages, currents, or charges, elements described as "high" or "pulled up" would then be "low" or "pulled down" compared to the new reference voltage or current. Thus, the exemplary term "high" may encompass both a relatively low or high voltage or current. The device may be otherwise based upon different electrical frames of reference and the electrical relative descriptors used herein interpreted accordingly.

The terminology used herein is for the purpose of describing particular example embodiments only and is not intended to be limiting of the present disclosed subject matter. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present disclosed subject matter.

Unless otherwise defined, all terms (including technical and scientific terms) used herein have the same meaning as commonly understood by one of ordinary skill in the art to which this disclosed subject matter belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments will be explained in detail with reference to the accompanying drawings.

FIG. 1 is a block diagram of an example embodiment of a system 100 in accordance with the disclosed subject matter. In various embodiments, the system 100 may include computing device, such as, for example, a processor, a system-on-a-chip (SoC), a laptop, desktop, workstation, personal digital assistant, smartphone, tablet, and other appropriate computers or a virtual machine or virtual computing device thereof.

In the illustrated embodiment, the system 100 may include a clock generator circuit 102 configured to generate a clock signal. That clock signal may then be distributed throughout the system 100. In various embodiments, this may involve a mesh or a tree structure.

In the illustrated embodiment, the system 100 may include a number of integrated clock gater (ICG) or clock gater circuits 104 (e.g., circuits 104A, 104B, and 104C). In various embodiments, these ICGs 104 may be configured to stop or halt the clock signal based upon one or more enable signals (not shown).

In the illustrated embodiment, the system 100 may include one or more logic circuits 106 (e.g., circuits 106A, 106B, and 106C), configured to perform a task. In various embodiments, these logic circuits 106 may include execution units (e.g., load/store units, arithmetic logic units, floating point, units, etc.), function unit block (FUB), combinatorial logic blocks (CLBs), or sub-portions thereof.

As described above, in various embodiments, the ICGs 104 may be configured to turn off the clock (and therefore the switching and power consumption) to a logic circuit 106. In various embodiments, these ICGs 104 may be integrated into or as part of the respective logic circuits 106.

In various embodiments, the ICGs 104 may also be configured to shape the clock signal, as well as gate it. Traditionally, ICG structures use additional gates in the critical timing path to accomplish the desired timing adjustment. As shown in the later figures, the ICGs 104, in the illustrated embodiment, do not include extra gates in the critical timing path.

Figure 2B:
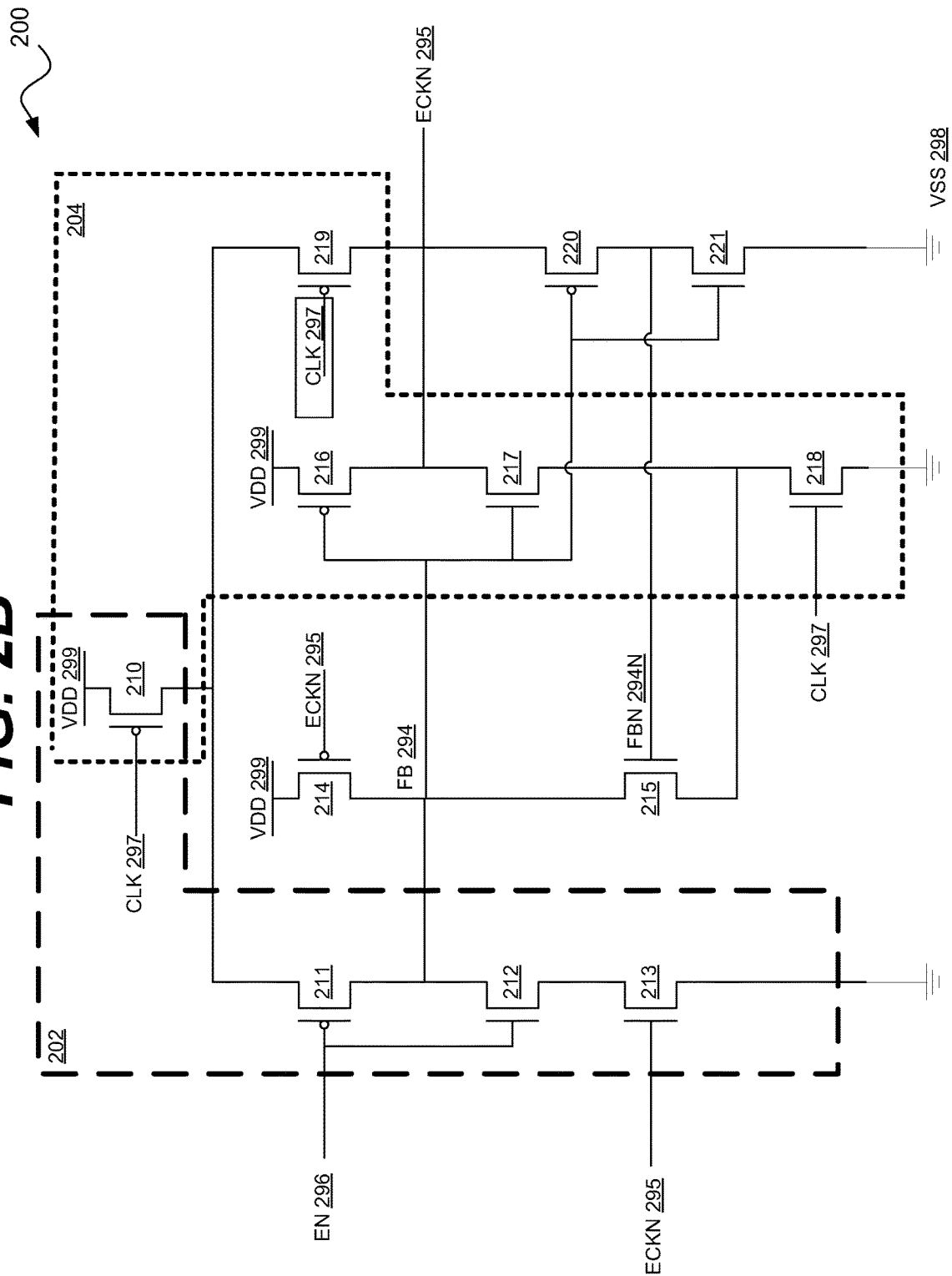
Figure 2C:
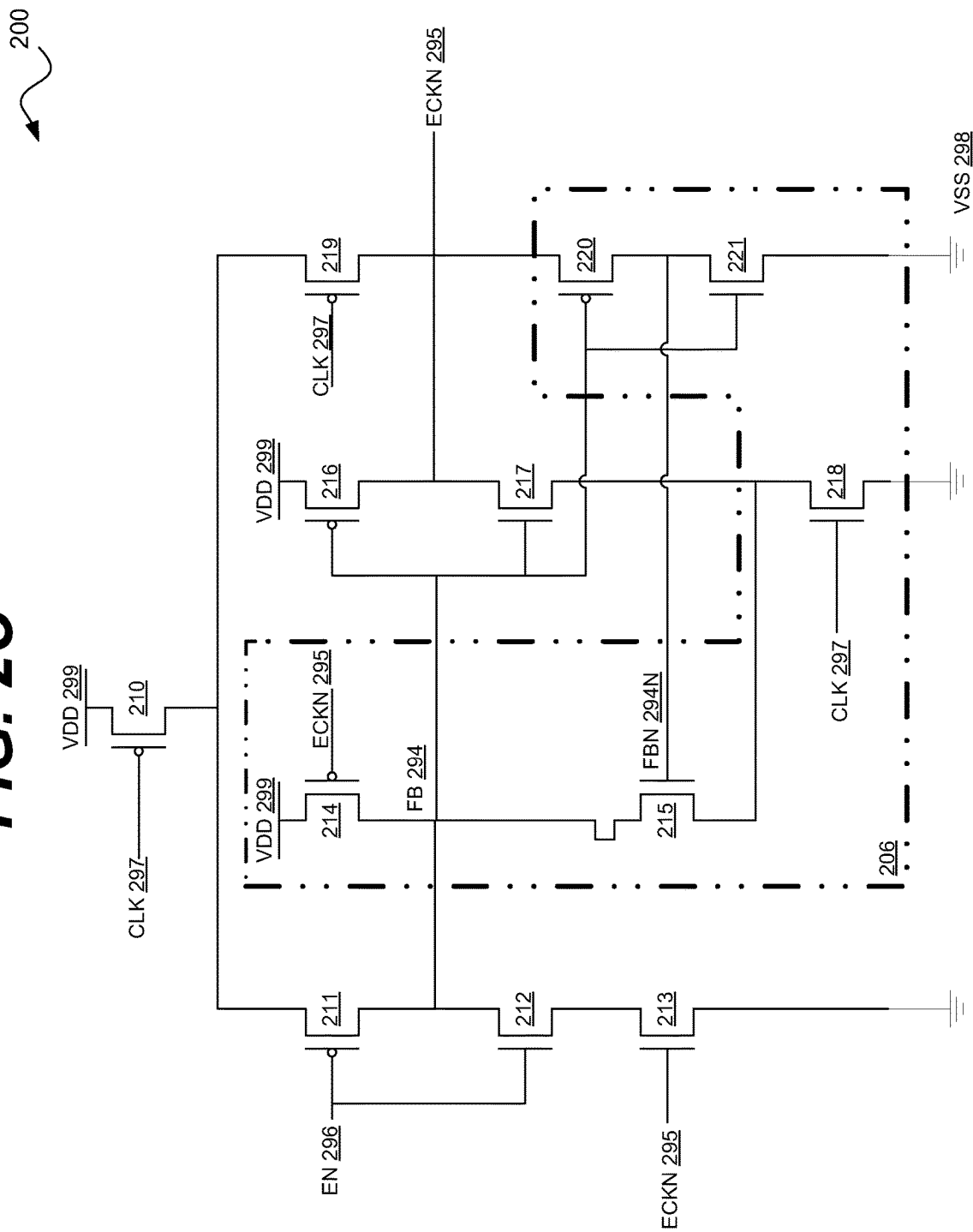

FIGS. 2A, 2B and 2C are circuit diagrams of an example embodiment of a circuit or system 200 in accordance with the disclosed subject matter. FIGS. 2A, 2B and 2C highlight different aspects of the system 200, as a single diagram of these aspects may prove overly cluttered. In various embodiments, the system 200 may include an integrated clock gater (ICG), as described above.

In various embodiments, the system 200 may be configured to pass a clock signal CLK 297 to the enabled clock signal ECK or the inverted enabled clock signal ECKN 295, based upon an (inverted) enable signal EN 296. In such an embodiment, when the enable signal EN 296 is active (e.g., low) the CLK signal 297 may freely be passed (in inverted form) to ECKN 295. Conversely, when the enable signal EN 296 is inactive (e.g., high) the enabled clock ECKN 295 may be held at a steady value (e.g., high). As described above, this may have the effect of powering off any logic circuits that rely upon the enabled clock ECKN 295 for synchronization.

In the illustrated embodiment, the system 200 may be powered by the power rails Vdd 299 and Vss 298. In various embodiments, the system 200 may make use of complementary metal-oxide-semiconductor (CMOS) technology, which uses two power sources: a high voltage (Vdd 299) and low voltage or ground (Vss298).

In the illustrated embodiment, the circuit 200 may include the P-type metal-oxide-semiconductor (PMOS) transistors 210, 211, 214, 216, 219, 220. The circuit 200 may include the N-type metal-oxide-semiconductor (NMOS) transistors 212, 213, 215, 217, 218, and 221. In various embodiments, the MOS transistors may include source, drain, and gate terminals.

In the illustrated embodiment, the transistors 210, 211, 212, and 213 may include an input stage 202 (highlighted in FIG. 2B). These transistors may be coupled in series between Vdd 299 and Vss 298. The transistor 210 may be controlled by or coupled via its gate terminal with the CLK signal 297. The transistors 211 and 212 may be controlled by the enable signal EN 296. The transistor 213 may be controlled by the output signal or inverted enabled clock 295.

In the illustrated embodiment, the transistors 210, 219, 216, 217 and 218 may include an output stage 204 (highlighted in FIG. 2B). These transistors may be coupled in series between Vdd 299 and Vss 298. The transistors 210 and 219 may be controlled by or coupled via its gate terminal with the CLK signal 297. The transistors 216 and 217 may be controlled by the feedback node or signal 294. The transistors 219, 217 and 218 may produce, at least in part, the output signal or inverted enabled clock 295.

In the illustrated embodiment, the transistors 214, 215, 218, 220, and 221 may include a feedback circuit 206 (highlighted in FIG. 2C). The transistors 214, 215, and 218 may be coupled in series between Vdd 299 and Vss 298. Likewise, the transistors 220 and 221 may be coupled in series between the inverted enabled clock 295 and Vss 298.

The transistors 220 and 221 may form an inverter coupled between the output signal or inverted enabled clock 295, and Vss 298. They may be controlled by the feedback node or signal 294. They may output the inverted feedback signal FBN 294N.

The transistors 216, 210, 219, 217 and 218 may form an NAND gate coupled between Vdd 299 and Vss 298. The transistors 216 and 217 may be controlled by the feedback node or signal 294. The transistors 210, 219 and 218 may be controlled by the CLK signal 297.

The transistors 216 and 217 may be coupled between Vdd 299 and the CLK 297 controlled transistor 218. Transistor 214 may be controlled by the output signal or inverted enabled clock 295. Transistor 215 may be controlled by the inverted feedback signal FBN 294N. The transistors 214 and 215 may produce, at least in part, the feedback signal 294.

In the illustrated embodiment, when the input clock signal CLK 297 is low and the input (inverted) enable signal EN 296 is low, the feedback node 294 is pulled high by the PMOS transistors 211 and 210. Also, whenever the CLK 297 is low, the PMOS transistor 210 and 219 pre-charge the ECKN signal 295 to high.

In such an embodiment, as CLK 297 transitions from low to high, the NMOS transistors 217 and 218 pull ECKN 295 low if the (inverted) enable signal EN 296 is active or low while CLK 297 is high. The transistor 214 keeps feedback node FB 294 high thus (via the transistors 217 & 218) ensuring that the ECKN 295 stays low.

Conversely, in the illustrated embodiment, if the input enable EN 296 is inactive or high, the NMOS transistors 212 and 213 pull the feedback node 294 low. When the clock CLK 297 transitions from low to high, since FB 294 is low, the output ECKN 295 is held high by PMOS transistor 216. At the same time, the transistors 220 and 221 form an inverter with ECKN 295 as the power or high voltage supply. The inverter's output is the inverted feedback signal FBN 294N, which is high as feedback node FB 294 is low. If the input enable EN 296 changes to active or low while CLK 297 is high, the transistors 215 and 218 keep the feedback node FB 294 low, and the ECKN 295 high, or inactive.

In such an embodiment, when the input enable EN 296 is inactive, ECKN 295 is prevented from switching or is gated. Conversely, when the input enable EN 296 is active, ECKN 295 follows (and inverts) CLK 297 or it can be said that CLK 297 is passed (in inverted form) to ECKN 295.

In such an embodiment, the transistor 210 may be shared between the input stage 202 and the output stage 204. Further, in various embodiments, the transistors 210 and 219 may be configured to serve a dual purpose of reducing leakage current in the output section stage 204 as well as balancing the enabled output clock ECKN 295 for the rise and fall delays. In various embodiments, the PMOS stacks 210 and 219 may be almost equivalent to the NMOS stacks of 217 and 218.

In various embodiments, as described above, an inverter formed by transistors 220 and 221 makes use of a voltage supply from ECKN 295. In such an embodiment, ensures that there are no unnecessary transitions or switching. As CMOS technology needs a voltage differential to work, when ECKN 295 is low (or the substantially the same as Vss 298), the inverter may not allow switching or may essentially power down. In such an embodiment, the system 200 is configured to have no full transitions from a high (Vdd 299) to a low (Vss 298) power rail when the enable signal EN 296 indicates that the enabled clock signal ECKN 295 should be disabled.

In the illustrated embodiment, the output of the inverter (inverted feedback signal FBN 294N) needs to be high only when EN 296 is active and CLK 297 is high. This means that ECKN 295 would have been high and needs to be retained high. The NMOS transistors 215 and 218 through FBN 294N and the high CLK 297 help retain FB 294 at low, which in-turn ensures that ECKN 295 is high. This means that power is lowered in both the ON and OFF modes (EN 296 active and inactive).

In the illustrated embodiment, the free-running or ungated clock CLK 297 may be connected to only three transistors: transistors 210, 219, and 218. In such an embodiment, if the enable signal EN 296 is inactive for an extended period of time, the loading of the CLK 297 net is reduced (compared to traditional designs), which means that the OFF or un-enabled power consumption is relatively low. Further, as described above. the circuit 200 has no internal full rail transitions when the enable signal EN 296 is inactive for multiple clock CLK 297 transitions.

In the illustrated embodiment, it is noted that the system 200 only takes a single clock signal CLK 297 as an input. Further, that clock signal CLK 297 is not delayed internally. Also, the clock signal CLK 297 is coupled directly with the gate terminals of transistors 210, 218, and 219. This is contrasted with traditional ICG designs in which either accept multiple free-running clock signals as input, or internally delay/invert the clock signal to produce control signals for pass-gates or other transistors. As described above, this minimal or reduced use of the clock signal CLK 297 means less capacitance on the clock network and hence less power consumption. It is understood that the above are merely a few illustrative examples to which the disclosed subject matter is not limited.

Figure 3:
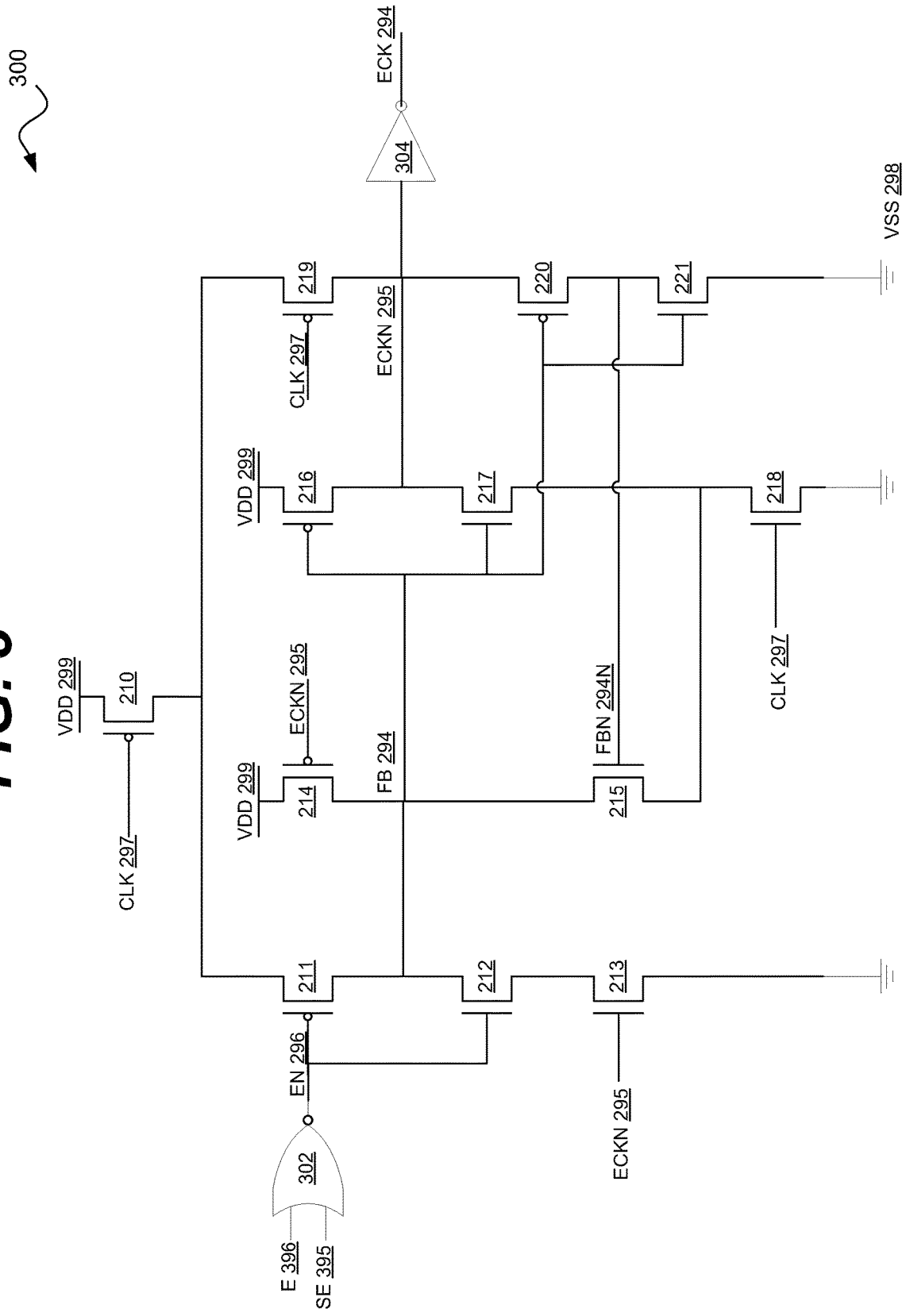
FIG. 3 is a circuit diagram of an example embodiment of a system in accordance with the disclosed subject matter.

FIG. 3 is a circuit diagram of an example embodiment of a circuit or system 300 in accordance with the disclosed subject matter. In various embodiments, the system 300 may include an integrated clock gater (ICG), as described above.

Similarly to the system described in reference to FIG. 2A, the system 300 may be configured to pass a clock signal CLK 297 to the enabled clock signal ECK 294, based upon the enable signals E 396 and SE 395.

In the illustrated embodiment, the system 300 may be powered by the power rails Vdd 299 and Vss 298. In various embodiments, the system 300 may make use of complementary metal-oxide-semiconductor (CMOS) technology, which uses two power sources: a high voltage (Vdd 299) and low voltage or ground (Vss298).

In the illustrated embodiment, the circuit 300 may include the P-type metal-oxide-semiconductor (PMOS) transistors 210, 211, 214, 216, 219, 220. The circuit 200 may include the N-type metal-oxide-semiconductor (NMOS) transistors 212, 213, 215, 217, 218, and 221. In various embodiments, the MOS transistors may include source, drain, and gate terminals.

In the illustrated embodiment, the system 300 may include an output inverter 304. The inverter 304 may be configured to invert the inverted enabled clock ECKN 295 to an un-inverted enabled clock ECK 294.

In the illustrated embodiment, the system 300 may be configured to input multiple enable signals. In such an embodiment, if any of the enable signals are active (or high) the system 300 may pass the free-running clock CLK 297 to the enabled clock signal 294. In the illustrated embodiment, the system 300 may include an enable circuit 302 that performs an OR or NOR Boolean operation on the enable signals (producing EN 296). In another embodiment, other logical combinations of the multiple enable signals may produce various states or modes of operations. It is understood that the above is merely one illustrative example to which the disclosed subject matter is not limited.

In the illustrated embodiment, the multiple enable signals may include a first enable signal E 396 that is configured to turn on/off the clock 297 as part of a power mode or other normal operation mode. In the illustrated embodiment, the multiple enables may include a second enable signal SE 395 that is configured to turn on/off the clock 297 when the circuit 300 is in a test mode, such as, for example, scan mode. It is understood that the above are merely a few illustrative examples to which the disclosed subject matter is not limited.

In various embodiments, the system 300 may include one or both of the inverter 304 or enable circuit 302. Further, it is understood that one skilled in the art will realize that the order, grouping, and even the number of the transistors may be altered to produce a similar effect. It is understood that the above is merely one illustrative example to which the disclosed subject matter is not limited.

Figure 4A:
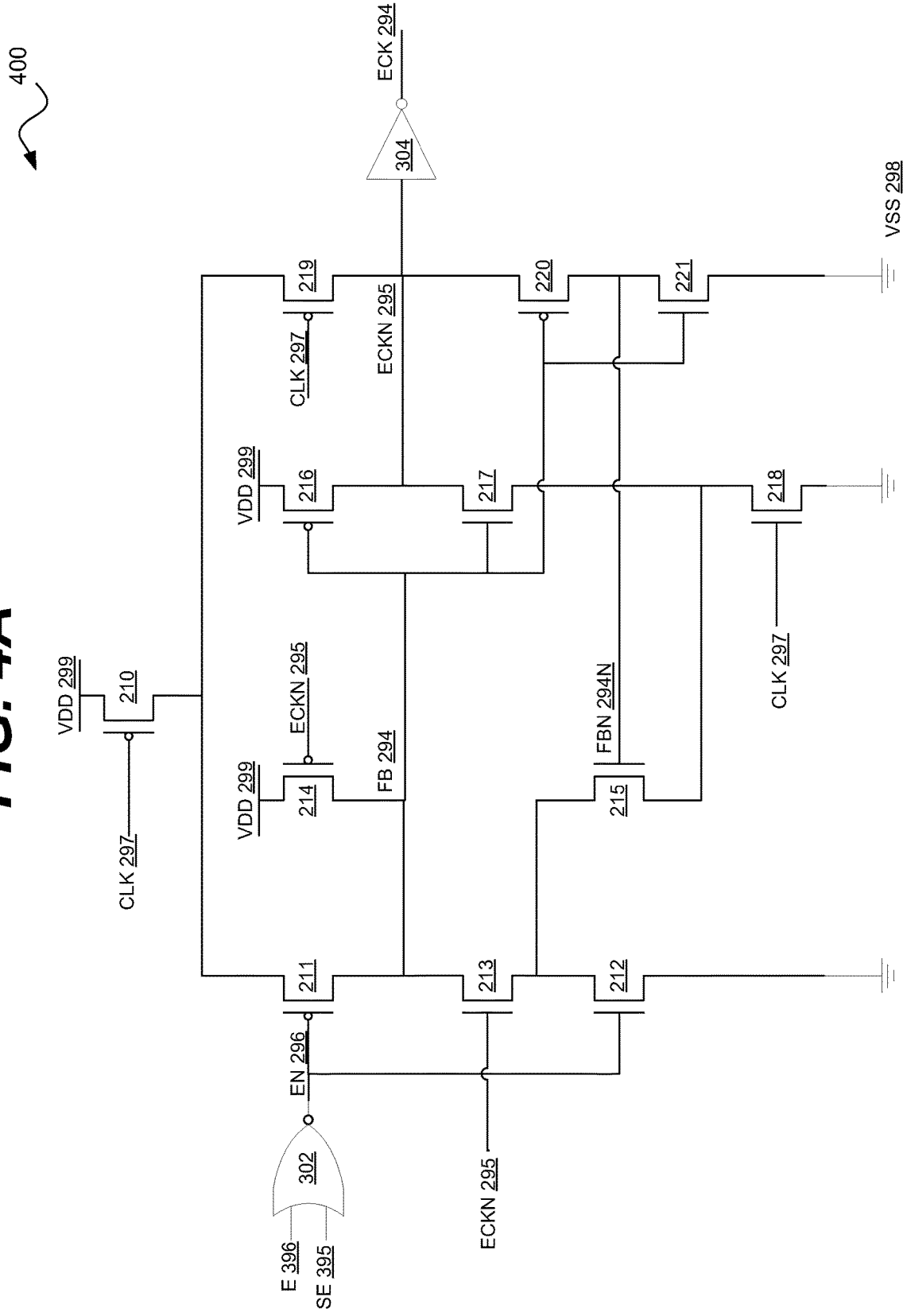
FIGS. 4A, 4B, 4C, and 4D are a circuit diagrams of example embodiments of systems in accordance with the disclosed subject matter.

FIG. 4A is a circuit diagram of an example embodiment of a system 400 in accordance with the disclosed subject matter. In various embodiments, the system 400 may include an integrated clock gater (ICG), as described above. Similarly to the system described in reference to FIG. 3, the system 400 may be configured to pass a clock signal CLK 297 to the enabled clock signal ECK 294, based upon the enable signals E 396 and SE 395.

In the illustrated embodiment, the system 400 may be powered by the power rails Vdd 299 and Vss 298. In the illustrated embodiment, the circuit 400 may include the P-type metal-oxide-semiconductor (PMOS) transistors 210, 211, 214, 216, 219, and 220. The circuit 400 may include the N-type metal-oxide-semiconductor (NMOS) transistors 212, 213, 215, 217, 218, and 221. In various embodiments, the MOS transistors may include source, drain, and gate terminals.

In the illustrated embodiment, the transistor 215 may be coupled at the drain terminal with the drain terminal of transistor 212. In the illustrated embodiment, the transistor 212 may be coupled in between the ground 298 and the transistor 213. Whereas the transistor 213 may be coupled in between the transistor 212 and transistor 211.

As described above, in various embodiments, the positioning, order, grouping, and even the number of the transistors may be altered to produce a similar effect. It is understood that the above is merely one illustrative example to which the disclosed subject matter is not limited.

Figure 4B:
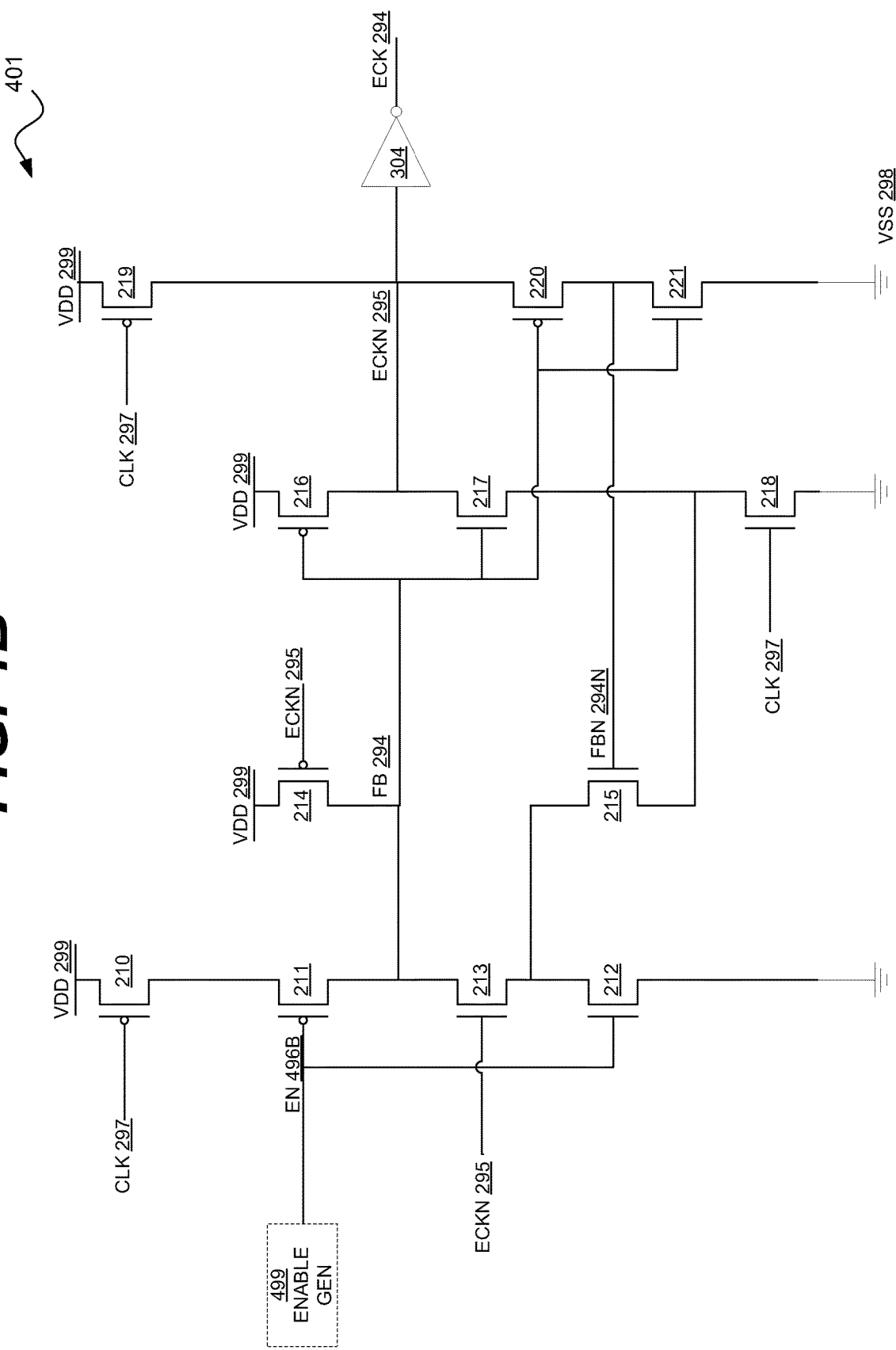

FIG. 4B is a circuit diagram of an example embodiment of a system 401 in accordance with the disclosed subject matter. In various embodiments, the system 401 may include an integrated clock gater (ICG), as described above. Similarly to the system described in reference to FIG. 3, the system 401 may be configured to pass a clock signal CLK 297 to the enabled clock signal ECK 294, based upon the enable signal EN 496B.

In the illustrated embodiment, the system 401 may be powered by the power rails VDD 299 and VSS 298. In the illustrated embodiment, the circuit 401 may include the P-type metal-oxide-semiconductor (PMOS) transistors 210, 211, 214, 216, 219, and 220. The circuit 401 may include the N-type metal-oxide-semiconductor (NMOS) transistors 212, 213, 215, 217, 218, and 221. In various embodiments, the MOS transistors may include source, drain, and gate terminals.

In the illustrated embodiment, the enable signal 496B may be generated by the enable generator circuit 499. In various embodiments, the enable generator circuit 499 may include the NOR gate previously show or similar, and combine multiple enable inputs into a single signal 496B. In another embodiment, other forms of logic (possibly more complex) may be used to produce the enable signal 496B. In yet another embodiment, the enable signal 496B may be a direct input without the enable generator circuit 499. In some embodiments, a second enable signal 496B may not be used at all.

In the illustrated embodiment, the transistor 210 may not be shared between the input and output stages of the system 401. Instead the transistor 219 may be coupled with Vdd 299 and not transistor 210. It is understood that the above is merely one illustrative example to which the disclosed subject matter is not limited.

As described above, in various embodiments, the positioning, order, grouping, and even the number of the transistors may be altered to produce a similar effect. It is understood that the above is merely one illustrative example to which the disclosed subject matter is not limited.

Figure 4C:
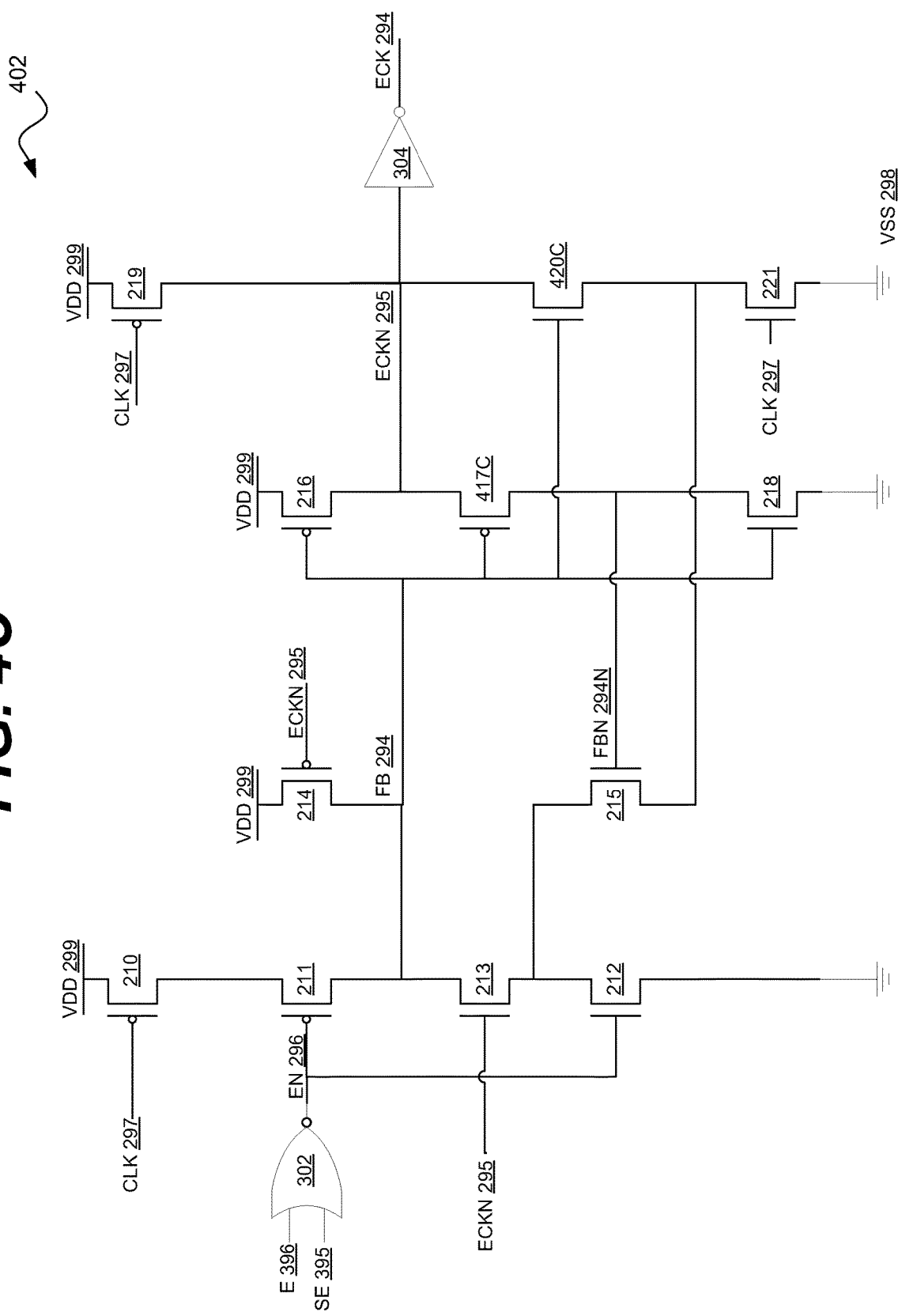

FIG. 4C is a circuit diagram of an example embodiment of a system 402 in accordance with the disclosed subject matter. In various embodiments, the system 402 may include an integrated clock gater (ICG), as described above. Similarly to the system described in reference to FIG. 3, the system 402 may be configured to pass a clock signal CLK 297 to the enabled clock signal ECK 294, based upon the enable signals E 396 and SE 395.

In the illustrated embodiment, the system 402 may be powered by the power rails Vdd 299 and Vss 298. In the illustrated embodiment, the circuit 402 may include the P-type metal-oxide-semiconductor (PMOS) transistors 210, 211, 214, 216, 219, and 417C. The circuit 402 may include the N-type metal-oxide-semiconductor (NMOS) transistors 212, 213, 215, 218, 221, and 420C. In various embodiments, the MOS transistors may include source, drain, and gate terminals.

In the illustrated embodiment, the transistor 420C may be coupled between the transistors 219 and 221. In such an embodiment, the transistor 420C may be controlled (via the gate terminal) with the feedback node FB 294.

In the illustrated embodiment, the transistor 417C may be coupled between the transistors 216 and 218. In such an embodiment, the transistor 417C may be controlled (via the gate terminal) with the feedback node FB 294.

In the illustrated embodiment, the transistor 210 may not be shared between the input and output stages of the system 402. Instead the transistor 219 may be coupled with VDD 299 and not transistor 210. It is understood that the above is merely one illustrative example to which the disclosed subject matter is not limited.

As described above, in various embodiments, the positioning, order, grouping, and even the number of the transistors may be altered to produce a similar effect. It is understood that the above is merely one illustrative example to which the disclosed subject matter is not limited.

Figure 4D:
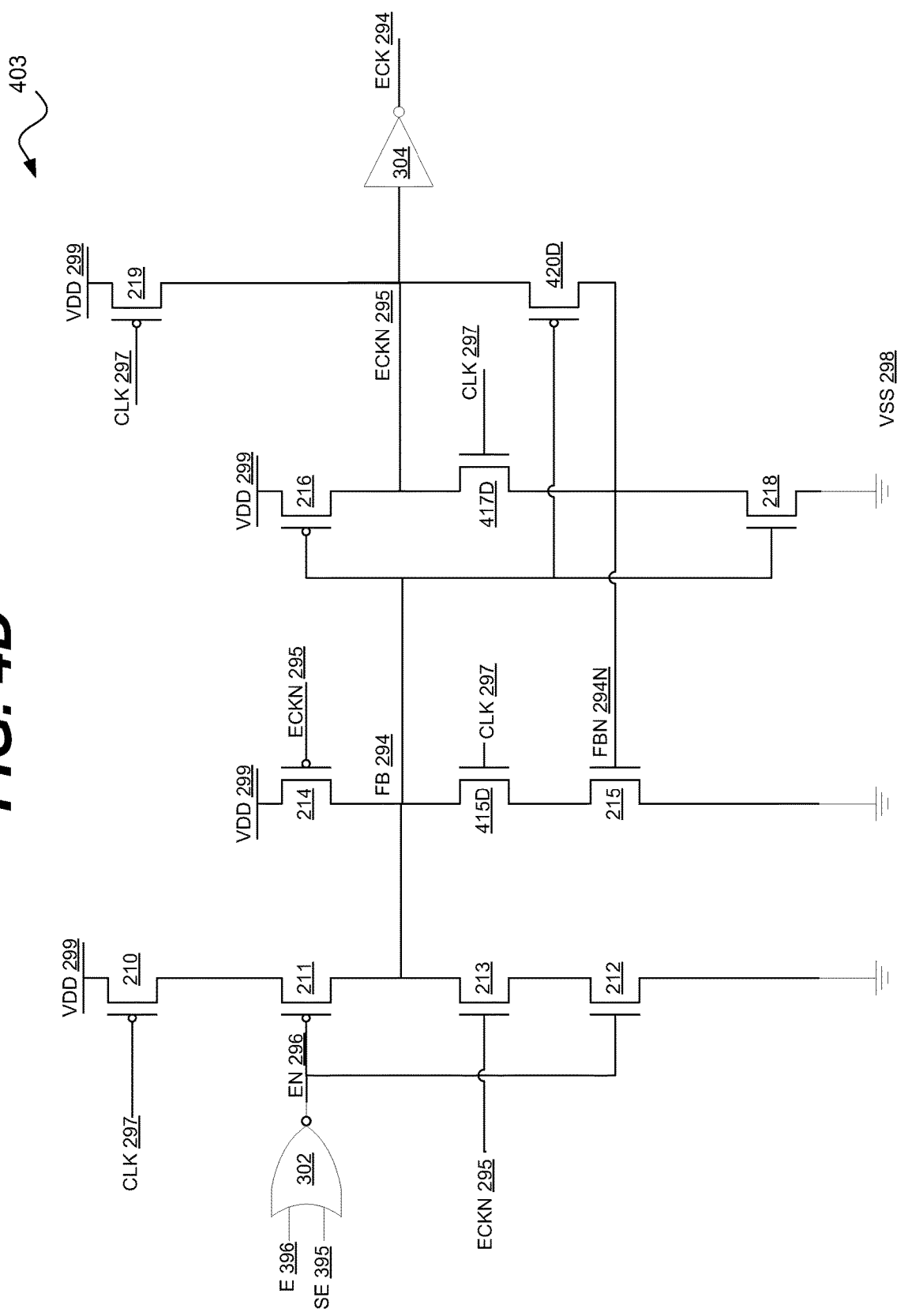

FIG. 4D is a circuit diagram of an example embodiment of a system 403 in accordance with the disclosed subject matter. In various embodiments, the system 403 may include an integrated clock gater (ICG), as described above. Similarly to the system described in reference to FIG. 3, the system 403 may be configured to pass a clock signal CLK 297 to the enabled clock signal ECK 294, based upon the enable signals E 396 and SE 395.

In the illustrated embodiment, the system 403 may be powered by the power rails Vdd 299 and Vss 298. In the illustrated embodiment, the circuit 403 may include the P-type metal-oxide-semiconductor (PMOS) transistors 210, 211, 214, 216, 219 and 420D. The circuit 403 may include the N-type metal-oxide-semiconductor (NMOS) transistors 212, 213, 215, 218, 415D, and 417D. In various embodiments, the MOS transistors may include source, drain, and gate terminals.

In the illustrated embodiment, the transistor 420D may be coupled with the transistors 219 and 215. In such an embodiment, the drain terminal of transistor 420D may be coupled with the gate terminal of transistor 215. In such an embodiment, the transistor 420D may be controlled (via the gate terminal) with the feedback node FB 294.

In the illustrated embodiment, the transistor 415D may be coupled between the transistors 214 and 215. In such an embodiment, the transistor 417D may be controlled (via the gate terminal) by the clock signal 297.

In the illustrated embodiment, the transistor 210 may not be shared between the input and output stages of the system 403. Instead the transistor 219 may be coupled with VDD 299 and not transistor 210. It is understood that the above is merely one illustrative example to which the disclosed subject matter is not limited.

As described above, in various embodiments, the positioning, order, grouping, and even the number of the transistors may be altered to produce a similar effect. It is understood that the above is merely one illustrative example to which the disclosed subject matter is not limited.

Figure 5:
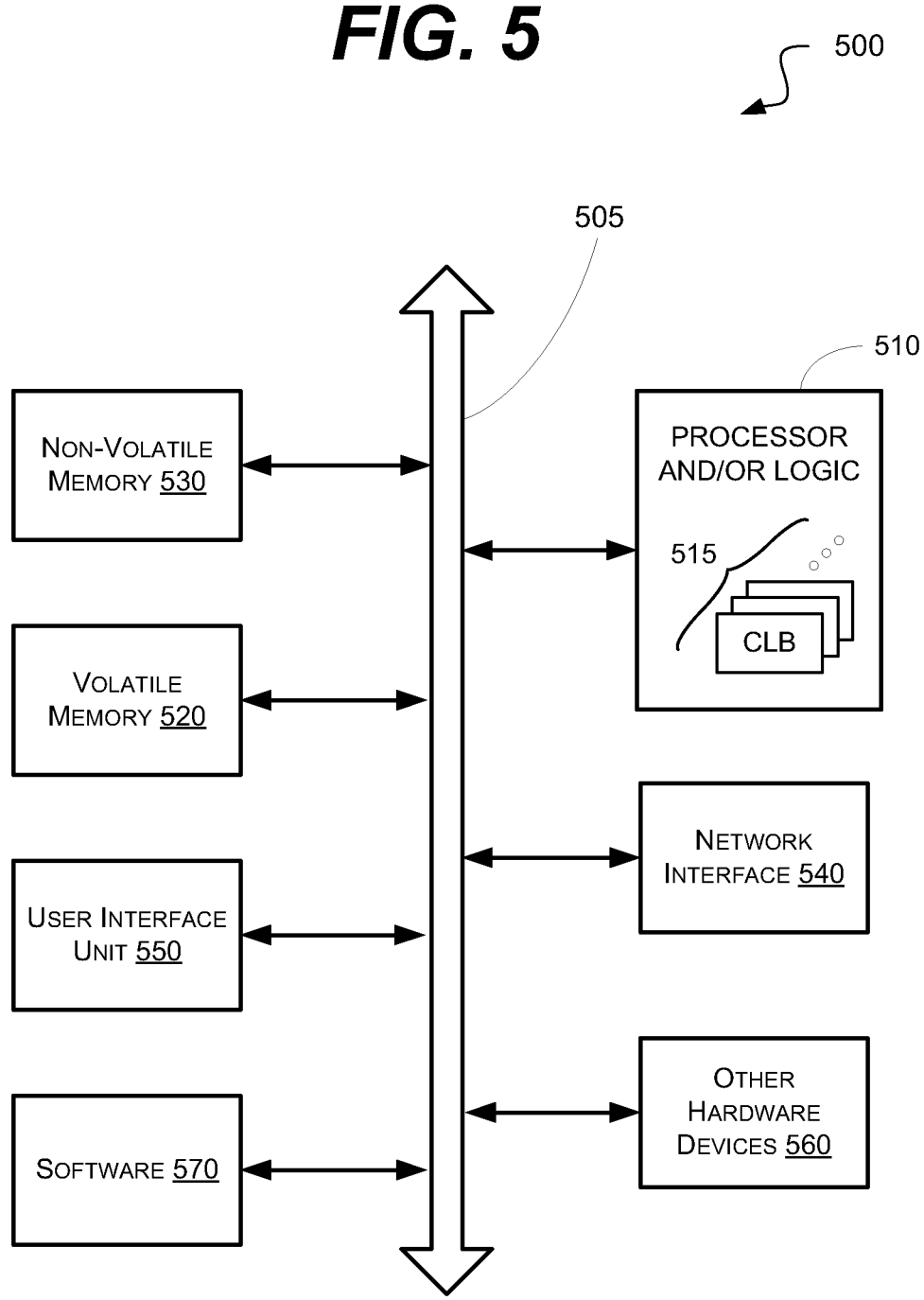
FIG. 5 is a schematic block diagram of an information processing system that may include devices formed according to principles of the disclosed subject matter.

FIG. 5 is a schematic block diagram of an information processing system 500, which may include semiconductor devices formed according to principles of the disclosed subject matter.

Referring to FIG. 5, an information processing system 500 may include one or more of devices constructed according to the principles of the disclosed subject matter. In another embodiment, the information processing system 500 may employ or execute one or more techniques according to the principles of the disclosed subject matter.

In various embodiments, the information processing system 500 may include a computing device, such as, for example, a laptop, desktop, workstation, server, blade server, personal digital assistant, smartphone, tablet, and other appropriate computers or a virtual machine or virtual computing device thereof. In various embodiments, the information processing system 500 may be used by a user (not shown).

The information processing system 500 according to the disclosed subject matter may further include a central processing unit (CPU), logic, or processor 510. In some embodiments, the processor 510 may include one or more functional unit blocks (FUBs) or combinational logic blocks (CLBs) 515. In such an embodiment, a combinational logic block may include various Boolean logic operations (e.g., NAND, NOR, NOT, XOR), stabilizing logic devices (e.g., flip-flops, latches), other logic devices, or a combination thereof. These combinational logic operations may be configured in simple or complex fashion to process input signals to achieve a desired result. It is understood that while a few illustrative examples of synchronous combinational logic operations are described, the disclosed subject matter is not so limited and may include asynchronous operations, or a mixture thereof. In one embodiment, the combinational logic operations may comprise a plurality of complementary metal oxide semiconductors (CMOS) transistors. In various embodiments, these CMOS transistors may be arranged into gates that perform the logical operations; although it is understood that other technologies may be used and are within the scope of the disclosed subject matter.

The information processing system 500 according to the disclosed subject matter may further include a volatile memory 520 (e.g., a Random Access Memory (RAM)). The information processing system 500 according to the disclosed subject matter may further include a non-volatile memory 530 (e.g., a hard drive, an optical memory, a NAND or Flash memory). In some embodiments, either the volatile memory 520, the non-volatile memory 530, or a combination or portions thereof may be referred to as a "storage medium". In various embodiments, the volatile memory 520 and/or the non-volatile memory 530 may be configured to store data in a semi-permanent or substantially permanent form.

In various embodiments, the information processing system 500 may include one or more network interfaces 540 configured to allow the information processing system 500 to be part of and communicate via a communications network. Examples of a Wi-Fi protocol may include, but are not limited to, Institute of Electrical and Electronics Engineers (IEEE) 802.11g, IEEE 802.11n. Examples of a cellular protocol may include, but are not limited to: IEEE 802.16m (a.k.a. Wireless-MAN (Metropolitan Area Network) Advanced, Long Term Evolution (LTE) Advanced, Enhanced Data rates for GSM (Global System for Mobile Communications) Evolution (EDGE), Evolved High-Speed Packet Access (HSPA+). Examples of a wired protocol may include, but are not limited to, IEEE 802.3 (a.k.a. Ethernet), Fibre Channel, Power Line communication (e.g., Home-Plug, IEEE 1901). It is understood that the above are merely a few illustrative examples to which the disclosed subject matter is not limited.

The information processing system 500 according to the disclosed subject matter may further include a user interface unit 550 (e.g., a display adapter, a haptic interface, a human interface device). In various embodiments, this user interface unit 550 may be configured to either receive input from a user and/or provide output to a user. Other kinds of devices may be used to provide for interaction with a user as well; for example, feedback provided to the user may be any form of sensory feedback, e.g., visual feedback, auditory feedback, or tactile feedback; and input from the user may be received in any form, including acoustic, speech, or tactile input.

In various embodiments, the information processing system 500 may include one or more other devices or hardware components 560 (e.g., a display or monitor, a keyboard, a mouse, a camera, a fingerprint reader, a video processor). It is understood that the above are merely a few illustrative examples to which the disclosed subject matter is not limited.

The information processing system 500 according to the disclosed subject matter may further include one or more system buses 505. In such an embodiment, the system bus 505 may be configured to communicatively couple the processor 510, the volatile memory 520, the non-volatile memory 530, the network interface 540, the user interface unit 550, and one or more hardware components 560. Data processed by the processor 510 or data inputted from outside of the non-volatile memory 530 may be stored in either the non-volatile memory 530 or the volatile memory 520.

In various embodiments, the information processing system 500 may include or execute one or more software components 570. In some embodiments, the software components 570 may include an operating system (OS) and/or an application. In some embodiments, the OS may be configured to provide one or more services to an application and manage or act as an intermediary between the application and the various hardware components (e.g., the processor 510, a network interface 540) of the information processing system 500. In such an embodiment, the information processing system 500 may include one or more native applications, which may be installed locally (e.g., within the non-volatile memory 530) and configured to be executed directly by the processor 510 and directly interact with the OS. In such an embodiment, the native applications may include pre-compiled machine executable code. In some embodiments, the native applications may include a script interpreter (e.g., C shell (csh), AppleScript, AutoHotkey) or a virtual execution machine (VM) (e.g., the Java Virtual Machine, the Microsoft Common Language Runtime) that are configured to translate source or object code into executable code which is then executed by the processor 510.

The semiconductor devices described above may be encapsulated using various packaging techniques. For example, semiconductor devices constructed according to principles of the disclosed subject matter may be encapsulated using any one of a package on package (POP) technique, a ball grid arrays (BGAs) technique, a chip scale packages (CSPs) technique, a plastic leaded chip carrier (PLCC) technique, a plastic dual in-line package (PDIP) technique, a die in waffle pack technique, a die in wafer form technique, a chip on board (COB) technique, a ceramic dual in-line package (CERDIP) technique, a plastic metric quad flat package (PMQFP) technique, a plastic quad flat package (PQFP) technique, a small outline package (SOIC) technique, a shrink small outline package (SSOP) technique, a thin small outline package (TSOP) technique, a thin quad flat package (TQFP) technique, a system in package (SIP) technique, a multi-chip package (MCP) technique, a wafer-level fabricated package (WFP) technique, a wafer-level processed stack package (WSP) technique, or other technique as will be known to those skilled in the art.

Method steps may be performed by one or more programmable processors executing a computer program to perform functions by operating on input data and generating output. Method steps also may be performed by, and an apparatus may be implemented as, special purpose logic circuitry, e.g., an FPGA (field programmable gate array) or an ASIC (application-specific integrated circuit).

In various embodiments, a computer readable medium may include instructions that, when executed, cause a device to perform at least a portion of the method steps. In some embodiments, the computer readable medium may be included in a magnetic medium, optical medium, other medium, or a combination thereof (e.g., CD-ROM, hard drive, a read-only memory, a flash drive). In such an embodiment, the computer readable medium may be a tangibly and non-transitorily embodied article of manufacture.

While the principles of the disclosed subject matter have been described with reference to example embodiments, it will be apparent to those skilled in the art that various changes and modifications may be made thereto without departing from the spirit and scope of these disclosed concepts. Therefore, it should be understood that the above embodiments are not limiting but are illustrative only. Thus, the scope of the disclosed concepts is to be determined by the broadest permissible interpretation of the following claims and their equivalents, and should not be restricted or limited by the foregoing description. It is, therefore, to be understood that the appended claims are intended to cover all such modifications and changes as fall within the scope of the embodiments.

What is claimed is:

1. An apparatus comprising:
    a latch circuit configured to, depending in part upon a state of at least one enable signal, pass a clock signal to an output signal, wherein the latch circuit comprises:
        a feedback circuit having an inverter, wherein the inverter is powered by the output signal,
        an input stage controlled by the clock signal and the at least one enable signal, and
        an output stage configured to produce the output signal, and
        wherein the input and output stages share a common transistor controlled by the clock signal.

2. The apparatus of claim 1, wherein the output stage includes the common transistor and a second transistor, both controlled by the clock signal and coupled in series so as to reduce leakage current from the output stage.

3. The apparatus of claim 1, wherein an output of the inverter is configured to be of a high voltage only when the clock signal and the at least one enable signal are both substantially at the high voltage.

4. The apparatus of claim 1, wherein the inverter is configured to power down based, at least in part, upon the at least one enable signal.

5. The apparatus of claim 1, wherein the output stage comprises a pre-charge circuit controlled by the clock signal.

6. The apparatus of claim 1, wherein the latch circuit is configured to have no full transitions from a high to a low power rail when the at least one enable signal indicate that the output signal should be disabled.

7. The apparatus of claim 1, wherein an output of the inverter is configured to be of a first voltage only when the clock signal and the at least one enable signal are both substantially at the first voltage.

8. A system comprising:
- a clock generator circuit configured to generate a first clock signal;
- a clock gater circuit configured to receive the first clock signal, and at least one enable signal as input, and generate a second clock signal; and
- a logic circuit configured to perform a logic function synchronized, at least in part by the second clock signal; and
- wherein the clock gater circuit comprises:
    - a feedback circuit having an inverter, wherein the inverter is powered by the second clock signal,
    - an input stage controlled by the first clock signal and the at least one enable signal, and
    - an output stage configured to produce the second clock signal, and
    - wherein the input and output stages share a common transistor controlled by the first clock signal.

9. The system of claim 8, wherein the clock gater circuit is configured to have no full transitions from a high to a low power rail when the at least one enable signal indicate that the second clock signal should be disabled.

\* \* \* \* \*